United States Patent [19]
deLeeuw

[11] 3,942,165
[45] Mar. 2, 1976

[54] DEVICE OPERATING WITH THE DISPLACEMENT OF MAGNETIC DOMAIN WALL

[75] Inventor: Franciscus Hermanus deLeeuw, Eindhoven, Netherlands

[73] Assignee: U.S. Philips Corporation, New York, N.Y.

[22] Filed: July 10, 1974

[21] Appl. No.: 487,018

[30] Foreign Application Priority Data
July 23, 1973  Netherlands...................... 7310196

[52] U.S. Cl............................................. 340/174 TF
[51] Int. Cl.²......................................... G11C 11/14
[58] Field of Search .............................. 340/174 TF

[56] References Cited
OTHER PUBLICATIONS
AIP Conference Proceedings, 18th Annual Conf. No. 10, Part I, Nov. 28–Dec. 1, 1972, pp. 398–402.
American Institute of Physics Conference Proceedings, No. 10, Part 1, Nov. 28–Dec. 1, 1972, Denver, pp. 393–397.

*Primary Examiner*—James W. Moffitt
*Attorney, Agent, or Firm*—Frank R. Trifari; Carl P. Steinhauser

[57] ABSTRACT

A data processing device utilizing magnetizable media operating with the displacement of magnetic domain walls, in particular walls of "bubble" domains, which are propelled by fields which move walls with a speed which is as large as possible, and are operative only for a restricted time, preferably shorter than 20 nanoseconds.

4 Claims, 5 Drawing Figures

DEVICE OPERATING WITH THE DISPLACEMENT OF MAGNETIC DOMAIN WALL

The invention relates to a device operating with the displacement of magnetic domain walls and comprising a layer of a magnetisable material having an easy axis of magnetisation substantially perpendicular to the plane of the layer, in which layer magnetic domain walls can be produced, maintained and moved, as well as a device to cause a magnetic propulsive field to influence magnetic domain walls present in the layer so as to move them between previously determined positions.

A field of application for devices of this type is, for example, data processing systems and notably devices in which magnetisable media through which magnetic domain walls can be moved are used for performing logic, display and memory functions. In this connection it is to be noted that both straight magnetic domain walls and, for example, circular domain walls which form the boundary of so-called magnetic "bubbles" are to be considered.

From the publication "Magnetic Bubbles a Technology in the making" *Electronics*, September, 1969, pp. 83–89, for example, devices are known in which thin films of a magnetisable material having an easy axis of magnetisation substantially perpendicular to the plane of the film are used, in which films single-walled magnetic domains, i.e. magnetic domains which are formed by a wall which is closed in itself and may assume the shape of a cylinder, are created. A bias magnetisation field having such a strength and polarity is produced that the individual domains can be maintained and moved as stable units. The displacement of such single-walled domains from one position to the other can be carried out by means of localized magnetic fields.

A controlled movement of the domains and the domain walls, respectively, is possible by means of a pattern of electric conductors to which multiphase currents are supplied in such manner that a domain is successively moved from one point to another along a previously determined track.

Another possibility of a controlled movement of magnetic domains and domain walls, respectively, consists of the use of a pattern of permalloy elements which have such a shape that, together with a rotating magnetic field which can be produced by means of electric windings arranged around the device, they force the domains to move in a given direction.

For use in data processing systems, however, it is a requirement that the rate of movement of the magnetic domain walls be so high that the same bit rates are realisable as can be achieved with electronic data processing systems.

In devices for the movement of domain walls as described above the domain wall is moved under the influence of the propulsive field by a certain force. It might be expected that an increase of the force on the wall always results in a larger speed of the domain wall during its movement to the next position. Upon further investigation it was found, however, that with low-loss materials, in particular garnets, which are suitable for use in data processing systems as described above just due to said property, the speed assumes a much lower value above a given critical force on the domain wall, at which force the speed of the domain wall is maximum, which value is substantially independent of the force exerted on the wall.

In copending application Ser. No. 463,732, filed Apr. 24, 1974 it has been proposed on the basis of the above to operate a domain wall device in such manner that the force on the domain wall is always just maintained below the said critical force. The speed at which the wall moves under this condition then is the maximum achievable speed.

Further investigations have proved, however, that also in the case in which the force on the domain wall is above the said critical force, the possibility exists to cause the wall to move at a speed which approximates the value of the above-mentioned maximum speed. In the first couple of nanoseconds after application of the driving force, the speed of the wall actually proves to increase rapidly to a very high value and then to decrease abruptly to the above-mentioned substantially constant value corresponding to the applied force. With high propulsive fields the variation of the wall speed with time thus is strongly non-linear.

The above-described effect may advantageously be used within the scope of the present invention the object of which is to provide a device operating with the displacement of magnetic domain walls and in which the domain walls are moved at the highest possible speed.

For that purpose the device according to the invention employs a propulsive field acting upon a domain wall during the which is pulsed with a pulse duration which is shorter than the time in which the function typical of the magnetisable material and representing the relation between the speed of the wall under the influence of the propulsive field and the time shows a discontinuity.

A preferred embodiment of the device according to the invention utilizes a pulse duration of the propulsive field shorter than 20 nanoseconds.

A further preferred embodiment of the device according to the invention utilizes a layer of magnetisable material which consists of a magnetisable material having a garnet crystal structure.

In a still further preferred embodiment of the device according to the invention the layer of magnetisable material consists of yttrium-iron garnet which contains gallium in a part of the iron sites and lanthanum in a part of the yttrium sites.

The invention will be described in greater detail, by way of example, with reference to the drawing.

Figure 1:
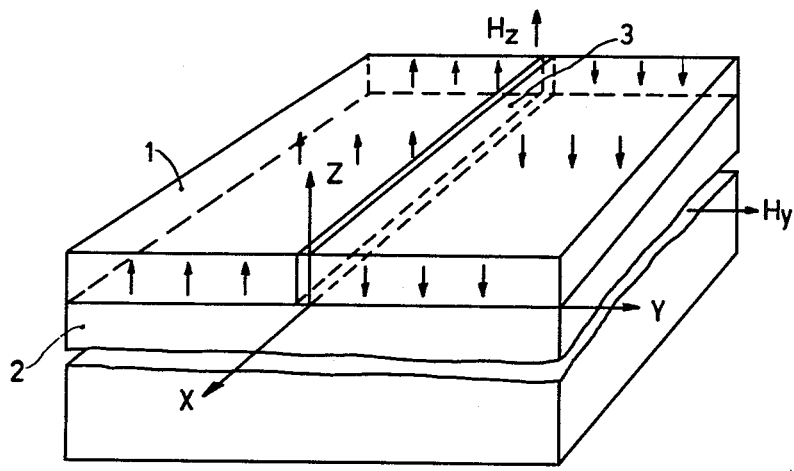
FIG. 1 shows a thin film of a magnetisable material in which a domain wall is present.
Figure 2:
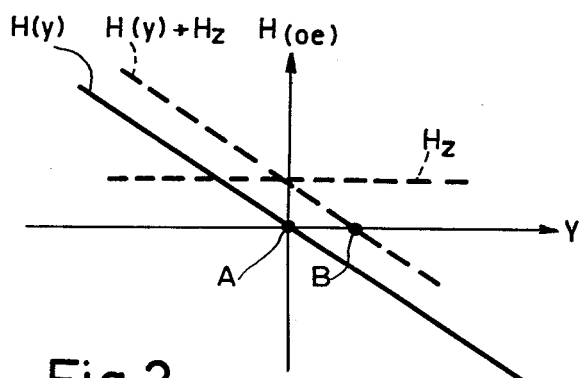
FIG. 2 shows the variation in the y direction of the magnetic field in which the film of FIG. 1 is present.
Figure 3:
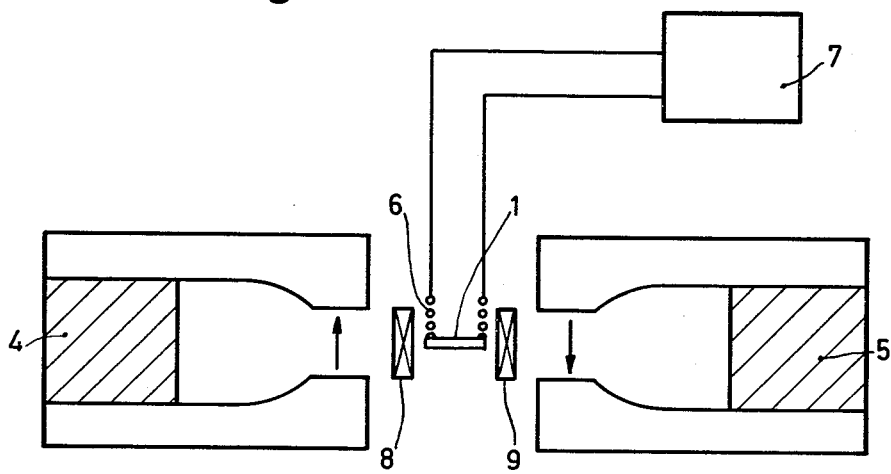
FIG. 3 shows a device to displace the domain wall in the film of FIG. 1.

FIG. 1 shows a thin film 1 of a magnetisable material having an easy axis of magnetisation perpendicular to the plane of the film. In the present case this was a film of the composition $Y_{2.9}La_{0.1}Fe_{3.8}Ga_{1.2}O_{12}$ (yttrium-iron-garnet with gallium in a part of the iron sites and lanthanum in a part of the yttrium sites) with a thickness of 3.9 $\mu$m. This is a material with very low losses. The film has been grown on a substrate 2 of gadolinium gallium garnet by means of epitaxy from the liquid phase. A domain wall 3 is present in film 1 which is formed by the application of a magnetic field perpendicularly to the plane of the film, of which field the field strength shows a gradient in the y direction (FIG. 2). The gradient field H(y) is produced by means of the permanent magnets 4 and 5 (FIG. 3). A (pulsatory) magnetic propulsive field $H_z$ is produced by means of an electric winding 6 which is present immediately on the thin film 1 and is connected to a (pulse) generator 7. Under the influence of the fields H(y) and $H_z$ the wall is displaced from the stable position A to the stable position B (FIG. 2). A static magnetic auxiliary field $H_y$ having a field direction perpendicular to the wall 3 is produced by means of the electric windings 8 and 9 or by placing the thin film 1 not exactly symmetrically relative to the permanent magnets 4 and 5. The displacement of the wall 3 under the influence of the propulsive field $H_z$ is detected magneto-optically by means of the Faraday effect.

Figure 4:
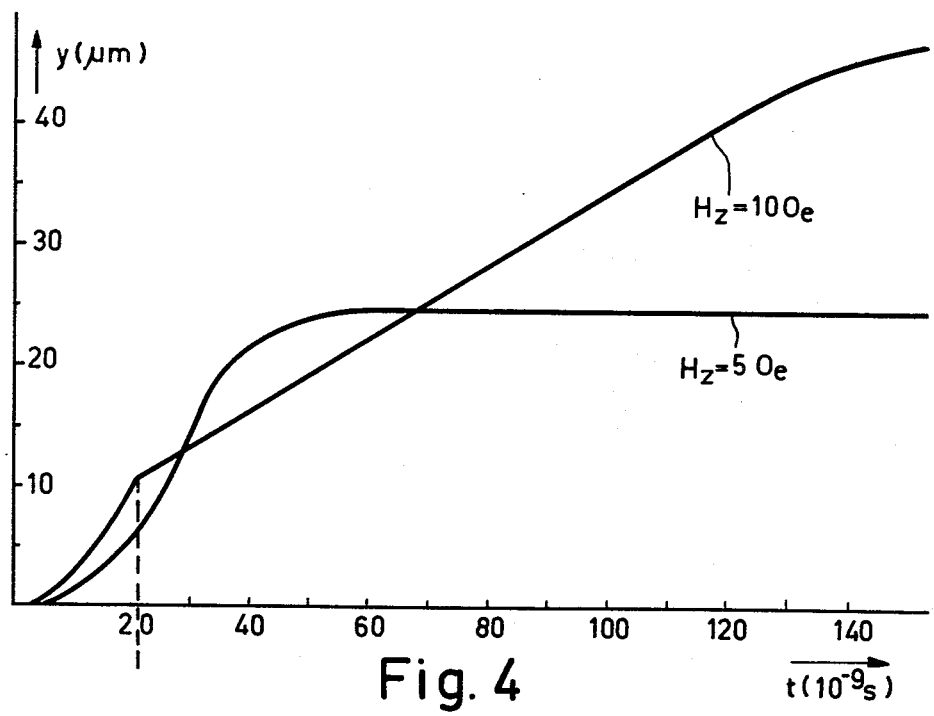
FIG. 4 shows the displacement of a domain wall in the time under the influence of propulsive fields with different amplitudes.

FIG. 4 shows for two different propulsive fields $H_z$ with a field strength of 5 Oersted and 10 Oersted, respectively, the displacement y in μm of the wall as a function of the time t in nanoseconds. It may be seen from the figure that the distance which the wall covers during the first 20 to 25 nanoseconds under the influence of the field of 10 Oersted is larger than the distance which it covers under the influence of the field of 5 Oersted. After this "switch-on period" this is no longer the case. After, for example, 50 nanoseconds the wall has covered a larger distance under the influence of the field of 5 Oersted than under the influence of the 10 Oersted field. In the case of the 5 Oersted field the average speed thus is larger than in the case of 10 Oersted. However, the particular and so far not known effect which occurs in the "switch-on period" may advantageously be used. This will be explained with reference to FIG. 5.

Figure 5:
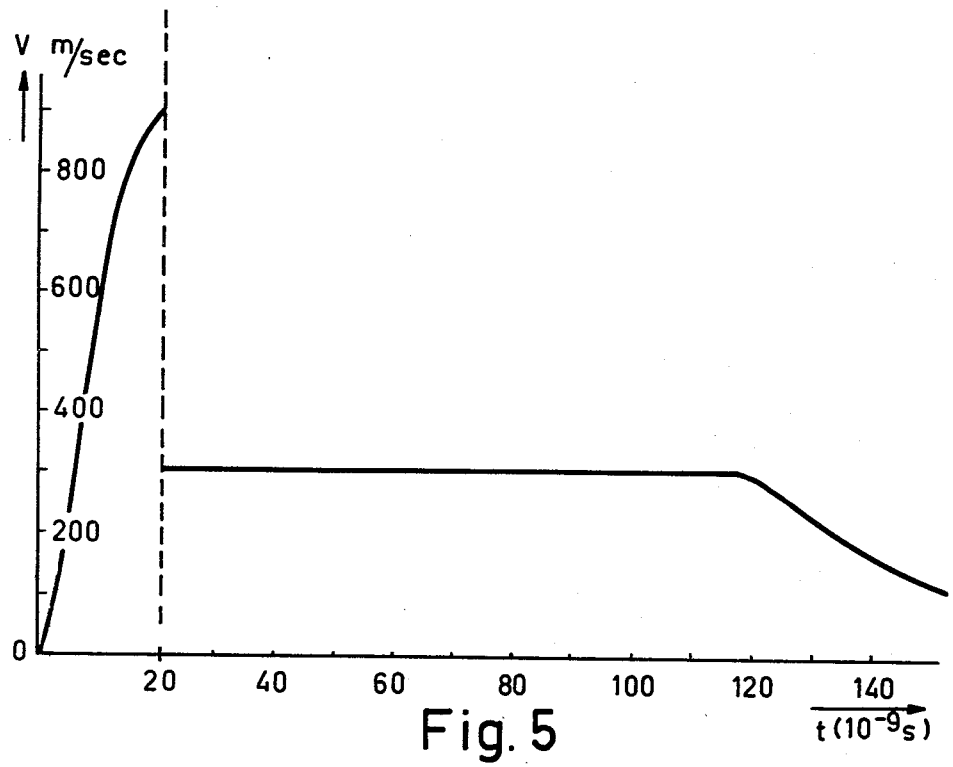
FIG. 5 is a graph showing the typical variation of the speed of a domain wall with the time under the influence of a propulsive field.

FIG. 5 shows the typical variation which the speed of the wall shows as a function of the time if it is propelled by a field which exerts a force on the wall which is larger than the above-mentioned "critical" force. Such a field is, for example, the 10 Oersted field described with reference to FIG. 4. It is obvious that during the first 20 nanoseconds after applying the propulsive field the speed increases considerably to a maximum value of approximately 900 m/sec. When the duration of the applied field is longer, an abrupt decrease of the speed, that is to say a discontinuity in the speed curve, appears to occur. In order to avoid the occurrence of said slow "mode", according to the invention, the pulse duration of the applied field should thus be shorter than the time for which the speed curve shows a discontinuity. That is to say in this case shorter than 20 nanoseconds. For comparison, in the known devices which operate with the displacement of magnetic domain walls the duration of the applied propulsive fields is in the order of microseconds, that is to say approximately a hundred times longer than the above-mentioned pulse duration. So it may be established that said devices are not operared optimally as regards the achievable speed of displacement of the domain walls.

It is to be noted that the variation of the speed with the time shown in FIG. 5 is typical of low-loss "bubble" materials, for example, ferromagnetic garnets. In principle these materials all show the same characteristic. However, the numerical values may differ, dependent upon the damping factor.

What is claimed is:

1. A data processing device utilizing magnetizable media operating with the displacement of magnetic domain walls and comprising a layer of a magnetisable material having an easy axis of magnetisation substantially perpendicular to the plane of the layer, means to produce and maintain magnetic domain walls in said layer, and means to produce a magnetic propulsive field to influence magnetic domain walls present in the layer so as to move them between previously determined positions, and means to pulse said propulsive field acting upon a domain wall during the movement having a pulse duration which is shorter than the time in which a function representing the relation between the speed at which the wall moves under the influence of the propulsive field and the time shows a discontinuity.

2. A device as claimed in claim 1, wherein the pulse duration of the propulsive field is shorter than 20 nanoseconds.

3. A device as claimed in claim 1, wherein the layer consists of a magnetisable material having a garnet crystal structure.

4. A device as claimed in claim 1, wherein the layer of magnetisable material consists of yttrium-iron garnet which contains gallium in a part of the iron sites and lanthanum in a part of the yttrium sites.

* * * * *